(12) United States Patent
Opris

(10) Patent No.: US 8,064,622 B1
(45) Date of Patent: Nov. 22, 2011

(54) SELF-BIASED AMPLIFIER DEVICE FOR AN ELECTRECRET MICROPHONE

(76) Inventor: Ion E. Opris, San Jose, CA (US)

(*) Notice: Subject to any disclaimer, the term of this patent is extended or adjusted under 35 U.S.C. 154(b) by 624 days.

(21) Appl. No.: 12/313,624

(22) Filed: Nov. 20, 2008

(51) Int. Cl.
*H03F 99/00* (2009.01)
*H04R 3/00* (2006.01)
(52) U.S. Cl. .................. 381/120; 381/122; 381/121
(58) Field of Classification Search .......... 381/120–122
See application file for complete search history.

(56) References Cited

U.S. PATENT DOCUMENTS

| 6,160,450 A * | 12/2000 | Eschauzier et al. ........... 330/253 |
| 6,456,155 B2 * | 9/2002 | Takai ........................... 327/541 |
| 6,788,143 B1 * | 9/2004 | Chen ............................ 330/253 |
| 6,888,408 B2 * | 5/2005 | Furst et al. .................... 330/277 |

* cited by examiner

*Primary Examiner* — Luan C Thai

(57) ABSTRACT

A self-biased electrecret microphone amplifier with phantom biasing is using only standard devices implemented in a digital Complementary Metal Oxide Semiconductor (CMOS) process. The stable gain is provided open loop with a self-biased linear transconductance amplifier device that does not require large external components for filtering.

12 Claims, 8 Drawing Sheets

SELF-BIASED AMPLIFIER DEVICE FOR AN ELECTRECRET MICROPHONE

TECHNICAL FIELD

The invention relates generally to amplifiers for condenser microphones, and more particularly, to self-biased, phantom powered amplifier devices for electrecret microphones.

BACKGROUND

Generally, an electrecret microphone has a permanently charged dielectric (electrecret) between two parallel metal plates, which constitute the electrodes, one of the electrodes (i.e., the diaphragm electrode) being attached to a mobile diaphragm that can move in response to pressure variations of sound waves. The other electrode (i.e., the backplate) does not move. This diaphragm movement changes the distance, and therefore, the capacitance, between the diaphragm electrode and the backplate. Since the amount of charge in the electrecret remains constant, the voltage between the diaphragm electrode and the backplate changes in a manner which is inversely proportional to the change in capacitance, in accordance with Equation 1 shown below.

$$Q = C \cdot V \qquad \text{Equation 1}$$

Usually this voltage is small (e.g., tens of miliVolt (mV)) and it is generated on a very high impedance, basically equal to the membrane capacitance. Therefore, there is a need to buffer and amplify this signal with a very high input impedance amplifier. Moreover, for economical reasons and compatibility with other microphone types, this amplifier has to be phantom powered, such that the direct current (DC) bias and the alternating current (AC) output signal share the same two physical wires. This characteristic is accomplished mainly by connecting the positive power supply line Vdd to the buffer amplifier through a load resistor $R_L$ and decoupling the output signal through a coupling capacitor $C_C$, as illustrated in FIG. 1. Several implementations for such a buffer amplifier are widely known in the industry, as discussed below.

FIG. 2 is a schematic diagram of a conventional buffer amplifier circuit using a junction gate filed-effect transistor (JFET) device. Referring to FIG. 2, the amplification is provided by a JFET (as described in U.S. Pat. No. 5,097,224).

A major disadvantage of such an approach appears to be the large variability of the gain due to the electrical characteristics of industrial JFETs used in the circuit and the fact that the JFET is not a standard component in a digital metal oxide semiconductor (MOS) process.

Several other circuits have been developed to use feedback techniques in order to stabilize the gain versus process and temperature variations and to provide correct biasing, as illustrated in FIG. 3 and FIG. 4, as well as described in U.S. Pat. No. 5,239,579, U.S. Pat. No. 5,337,011, and U.S. Pat. No. 5,577,129.

Another implementation is further described in U.S. Pat. No. 6,160,450, and is illustrated in FIG. 5. FIG. 5 is a schematic diagram of a buffer amplifier circuit that requires very small and controllable input offset and a low value internal series resistor. One of the drawbacks of this circuit appears to be that it requires a very well controlled offset voltage at the input pair to set the general bias, as well as the fact that overall gain is determined by a direct ratio between the external load resistor $R_{501}$ and an internal resistor $R_{502}$, according to Equation 2.

$$\text{gain} = \frac{R_{501}}{R_{502}} \qquad \text{Equation 2}$$

Since the DC power of the amplifier/buffer is supplied through the load resistor $R_{501}$ shown in FIG. 5, the value of this resistor cannot be made very large, otherwise a large DC drop will develop across it, requiring a very large DC voltage supply. Hence, in order to get reasonable gains according to Equation 2, the internal resistor $R_{502}$ needs to be very small, in some cases well under 100 ohms, for example. The value of the resistor $R_{502}$ and hence the gain is harder to control at low resistance values due to layout routing.

It would be advantageous, therefore, to provide a self-biased, phantom powered buffer amplifier device for an electrecret microphone without the aforementioned drawbacks.

SUMMARY

A self-biased, phantom powered buffer amplifier for an electrecret microphone according to the invention uses a linear transconductance amplifier to achieve a stable gain, high dynamic range and linearity, and good temperature stability.

In accordance with embodiments described in detail below, a self-biased phantom powered buffer amplifier for an electrecret microphone includes an input terminal, a power and signal terminal, a reference terminal, an input biasing diode, a current source circuit, and a linear transconductance amplifier. The power and signal terminal is further configured to couple to a DC power supply via a load impedance and to an output signal circuit, carrying the DC power for the buffer amplifier and carrying an amplified signal to the output signal circuit. The reference terminal is further configured to couple and provide a return DC path to the power supply and, in addition, to couple to a reference electrode of an electrecret microphone. The current source circuit is coupled to the power and signal terminal and is further configured to receive a portion or predetermined amount of the DC power signal and provide bias currents for the transconductance amplifier. The transconductance amplifier includes a first input terminal configured to couple to the signal electrode of the electrecret microphone and to receive a microphone signal therefrom, a second terminal configured to couple to the power and signal terminal of the buffer amplifier, wherein the current in this second terminal is substantially proportional to the microphone signal, a third terminal coupled to the reference terminal of the buffer amplifier to provide a reference level for the input signal, and a fourth and subsequent terminals coupled to the current source circuit from appropriate bias levels.

In an alternate embodiment, the linear transconductance amplifier uses cascode devices to improve its output impedance and linearity.

These and other features of the present invention will be apparent from consideration of the following detailed description of the invention and the accompanying drawings.

DETAILED DESCRIPTION

Figure 1:
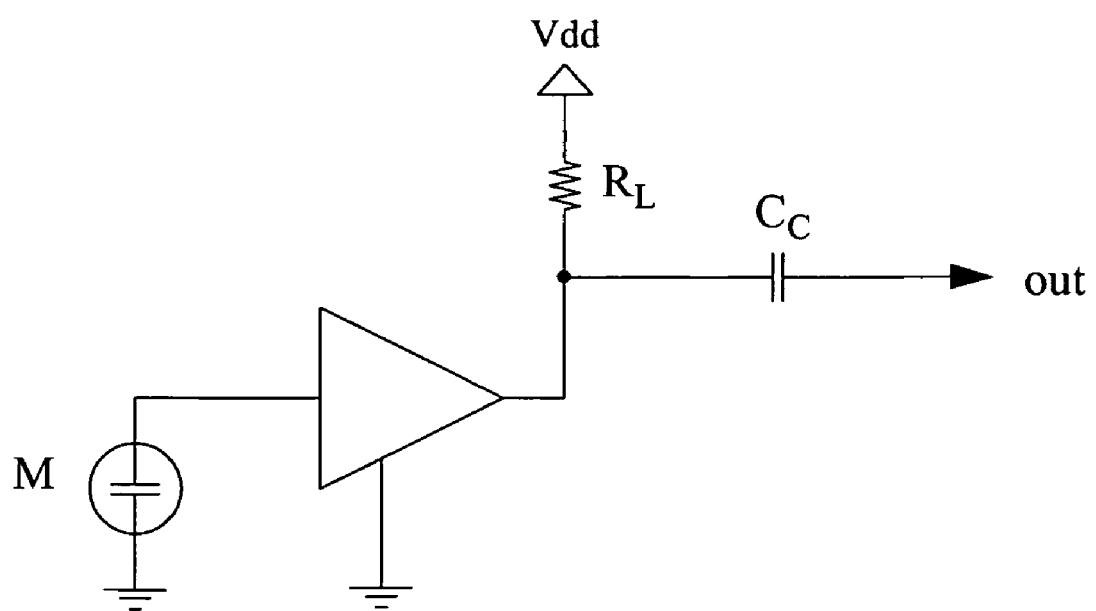
FIG. 1 is a schematic diagram of a conventional buffer amplifier with phantom powering for an electrecret microphone. (Prior Art)
Figure 2:
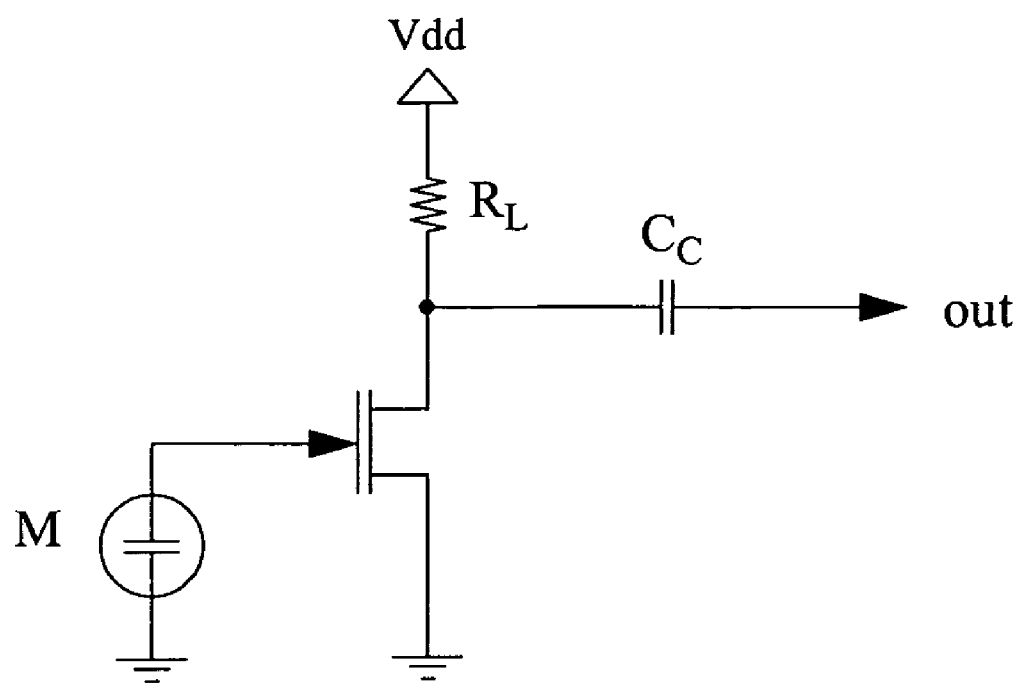
FIG. 2 is a schematic diagram of a conventional buffer amplifier circuit using a junction gate field-effect transistor (JFET) device. (Prior Art)
Figure 3:
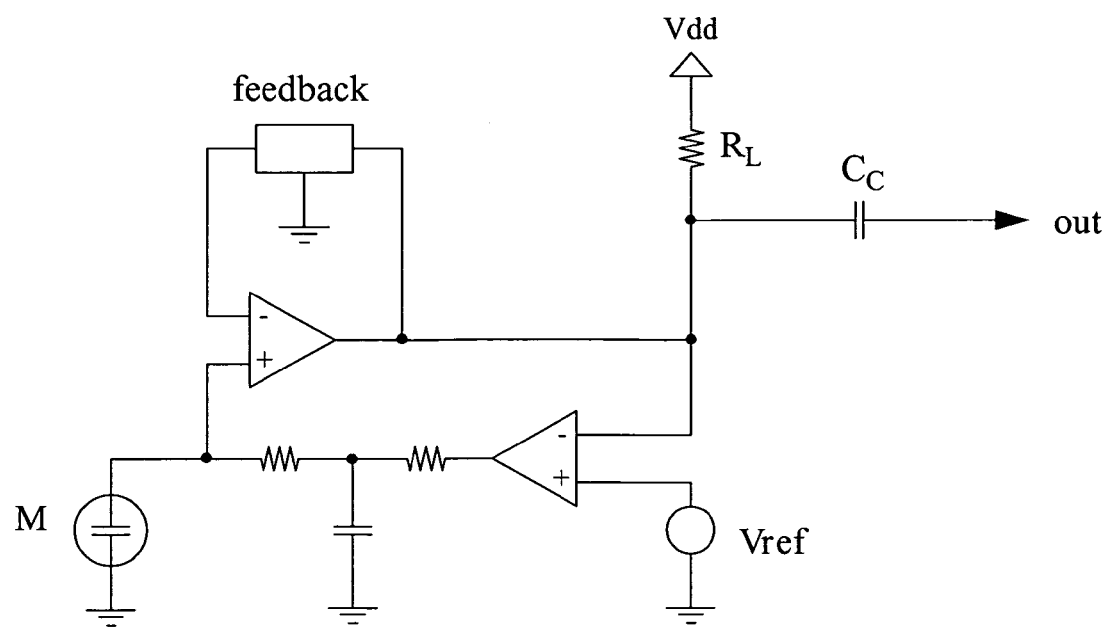
FIG. 3 is a schematic diagram of a conventional buffer amplifier circuit with a DC bias loop which requires bypass filtering. (Prior Art)
Figure 4:
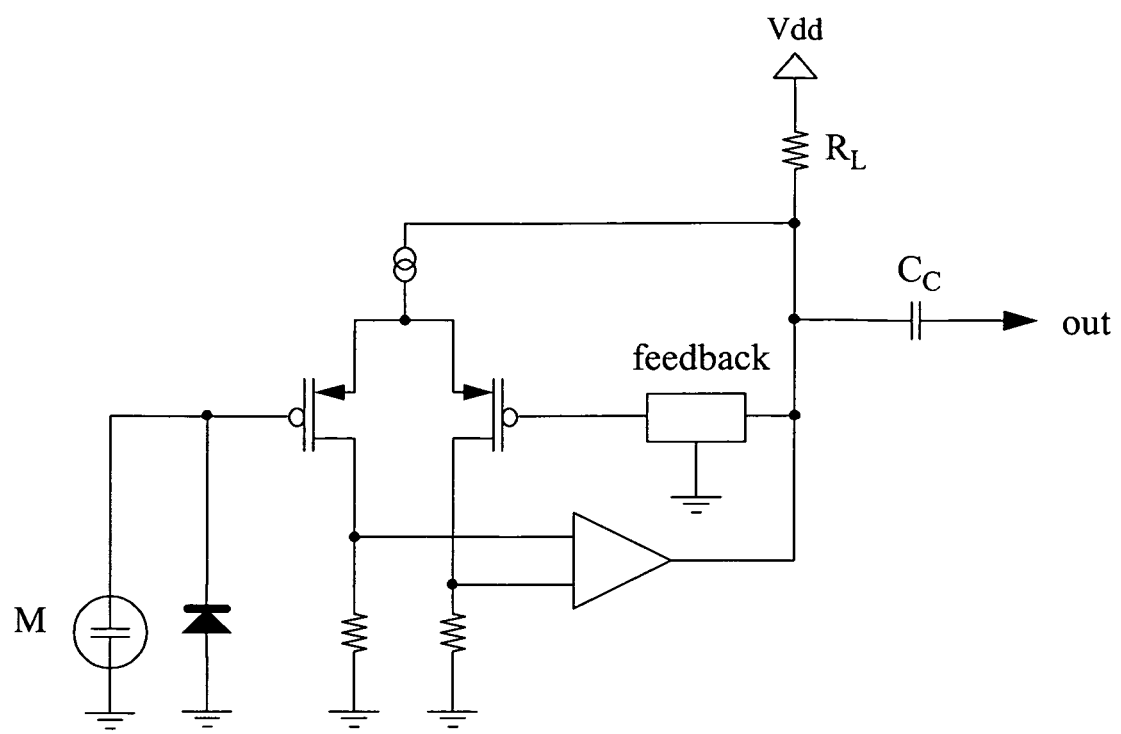
FIG. 4 is a schematic diagram of a conventional buffer amplifier circuit for replacing a conventional JFET device. (Prior Art)
Figure 5:
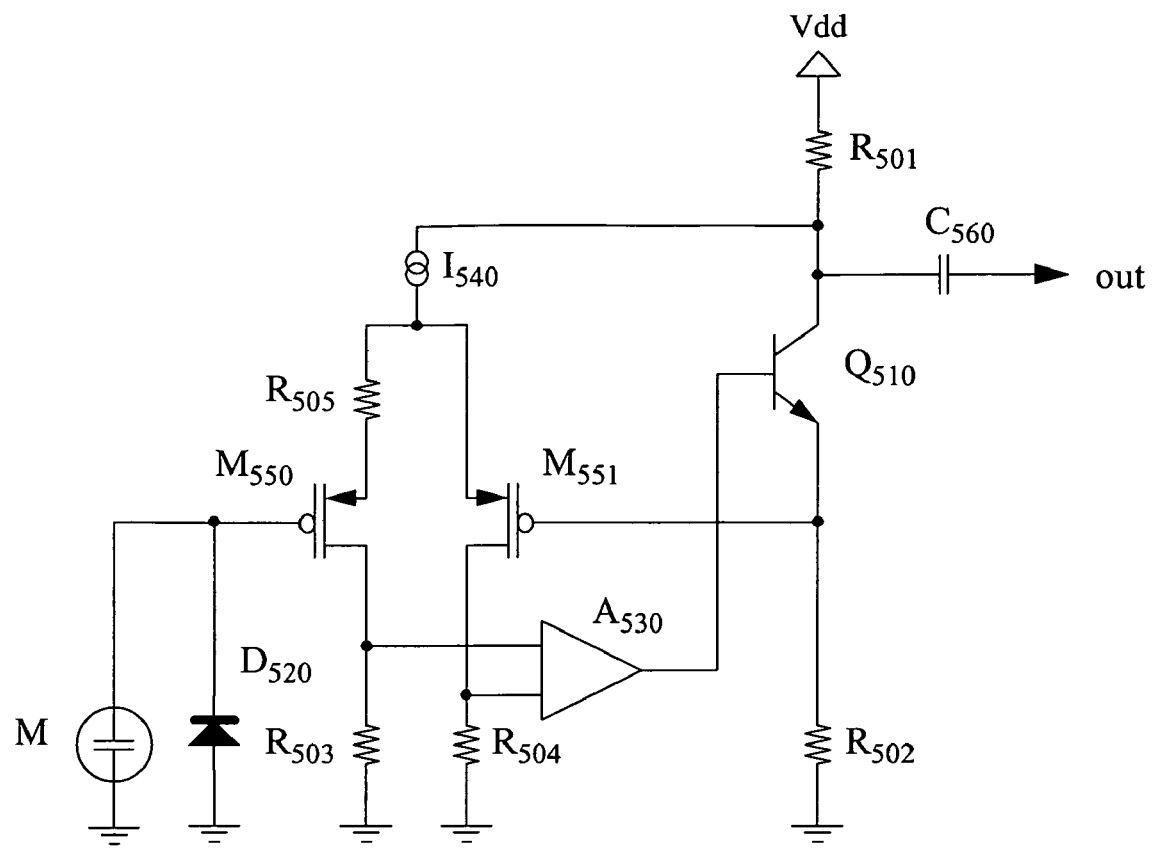
FIG. 5 is a schematic diagram of a buffer amplifier circuit that requires very small and controllable input offset and a low value internal series resistor. (Prior Art)
Figure 6:
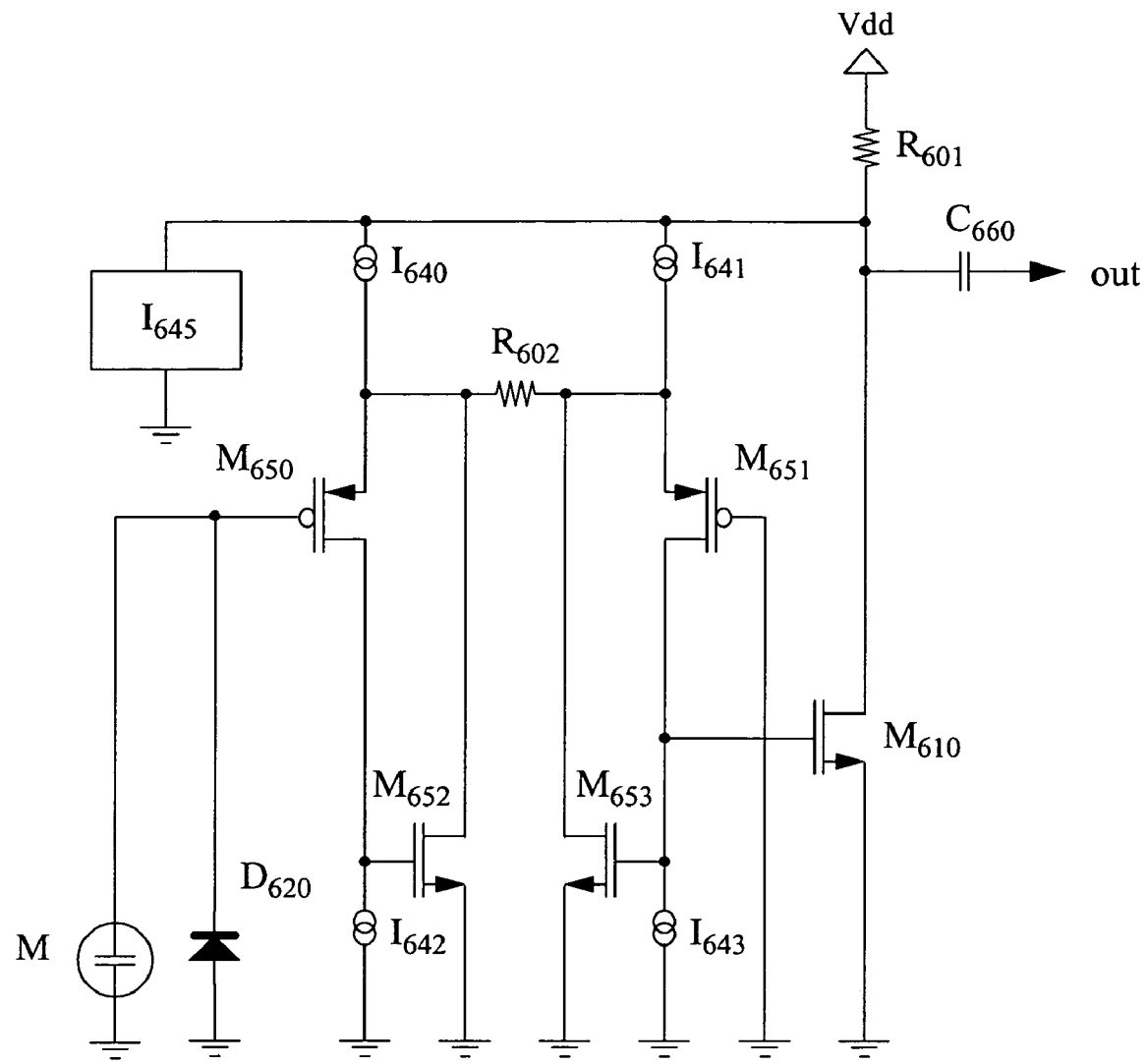
FIG. 6 is a schematic diagram of a self-biased, phantom powered buffer amplifier device for an electrecret microphone, according to one embodiment of the invention.

FIG. 6 is a schematic diagram of a self-biased, phantom powered buffer amplifier device for an electrecret microphone, according to one embodiment of the invention. As shown in FIG. 6, in one embodiment, a phantom powered buffer amplifier device for an electrecret microphone is self-biased in a manner similar to a conventional JFET amplifier, but provides the performance of a feedback stabilized amplifier device.

In one embodiment, the phantom power terminal connects to the power supply Vdd via a load resistor $R_{601}$ and to an output terminal for providing the amplified microphone signal out via a coupling capacitor $C_{660}$. The reference terminal completes the return DC path to the reference terminal of the power supply.

In one embodiment, a linear transconductance amplifier device is formed by transistors $M_{650}$, $M_{651}$, $M_{652}$, $M_{653}$, and the resistor $R_{602}$. The MOS device $M_{650}$ is self-biased at its gate terminal with a shunt connected diode $D_{610}$. The electrecret microphone is connected across the bias diode $D_{610}$. Due to self-biasing, the diode $D_{610}$ keeps the average of the gate level of transistor $M_{650}$ at the reference potential. Via the feedback through the transistor $M_{652}$, the current source $I_{642}$ sets a constant drain current through the input device $M_{650}$, and, therefore, a constant gate-to-source voltage. A similar circuit is implemented with $M_{651}$, $M_{653}$, and current source $I_{643}$. A current source $I_{645}$ generates and provides bias levels for the main transconductance amplifier device and current sources $I_{640}$, $I_{641}$, $I_{642}$, and $I_{643}$.

Since the gate-to-source voltage of the matched MOS devices $M_{640}$ and $M_{641}$ are substantially matched and constant, any signal voltage change at the input terminal (gate of $M_{650}$) will be reflected on the resistor $R_{602}$, between the sources of devices $M_{650}$ and $M_{651}$.

In one embodiment, the current signal through the resistor $R_{602}$ given by $$\Delta I_{R_{602}} = \frac{\Delta V_{in}}{R_{602}} \quad \text{Equation 3}$$

is reflected in the current through the MOS devices $M_{652}$ and $M_{653}$ as shown in Equations 4 and 5 below:

$$I_{ds_{652}} = I_{640} - I_{642} - \Delta I_{R_{602}}$$

$$I_{ds_{653}} = I_{641} - I_{643} + \Delta I_{R_{602}}$$

The output MOS transistor $M_{610}$ is a replica of the transistors $M_{652}$ and $M_{653}$ with a larger W/L ratio, as shown in Equation 6.

$$\left(\frac{W}{L}\right)_{M_{610}} = N \cdot \left(\frac{W}{L}\right)_{M_{653}} \quad \text{Equation 6}$$

Therefore, the variable part of the output transistor drain to source current will be proportional to the input signal, as shown in Equation 7.

$$\Delta I_{ds_{610}} = N \cdot \Delta I_{ds_{653}} = N \cdot \frac{\Delta V_{in}}{R_{602}} \quad \text{Equation 7}$$

In one embodiment, using a constant bias current for the linear transconductance amplifier, "constant" referring to the fact that the bias current is substantially independent from the power and signal terminal voltage level, the entire circuit will have a power consumption related to the input signal by Equation 7. Any variation of the total current consumption will develop a voltage signal at the power and signal terminal on the load resistor R. Therefore, the global voltage gain is given by Equation 8.

$$G = \frac{\Delta V_{out}}{\Delta V_{in}} = -N \cdot \frac{R_{601}}{R_{602}} \quad \text{Equation 8}$$

This gain is linear and largely independent of individual MOS device characteristics. Moreover, the gain can easily change by changing the transconductance resistor $R_{602}$ or the current mirror ratio N.

The quiescent current through the output device, which is the dominant term in the overall circuit quiescent current is calculated in Equation 9.

$$I_{ds_{610}} = N \cdot (I_{641} - I_{643}) \quad \text{Equation 9}$$

The Equations 8 and 9 enable the designer to choose independently the quiescent power dissipation and gain. However, Equation 3 holds only for a limited range of input signal such that, in Equation 10:

$$\Delta V_{in} < R_{602} \cdot (I_{641} - I_{643})$$

As is the case with other implementations, the quiescent current is related to the maximum linear range and gain, as shown in Equation 11.

(11)

$$I_{ds_{610}} = N \cdot \frac{(\Delta V_{in})_{max}}{R_{602}} \quad \text{Equation 11}$$

Figure 7:
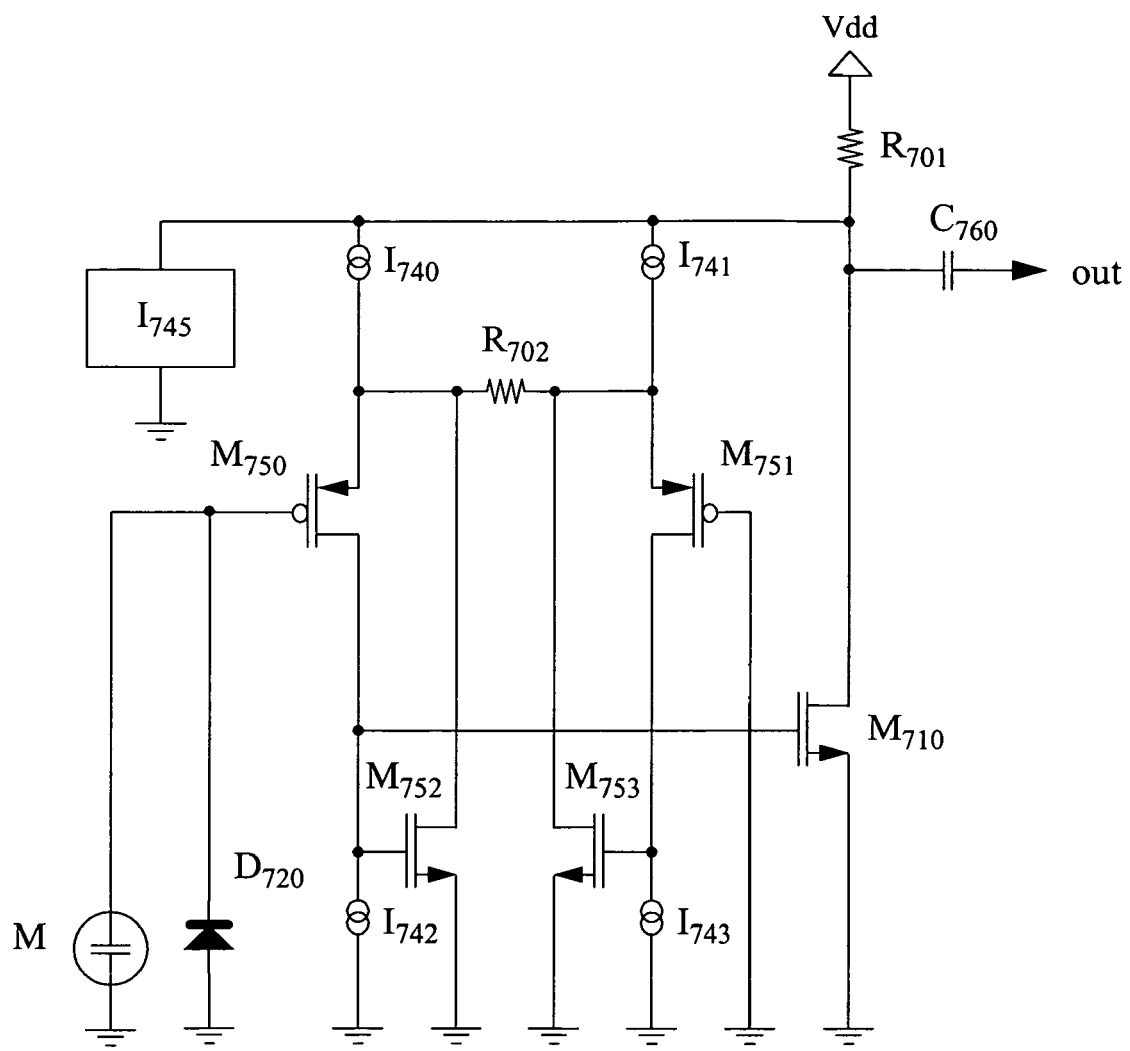
FIG. 7 is a schematic diagram of a self-biased, phantom powered buffer amplifier device for an electrecret microphone, according to an alternate embodiment of the invention.

FIG. 7 is a schematic diagram of a self-biased, phantom powered buffer amplifier device for an electrecret microphone, according to an alternate embodiment of the invention. As illustrated in FIG. 7, the gate of the output transistor $M_{710}$ is connected to the gate of transistor $M_{652}$ rather than the gate of $M_{653}$. The analysis described in detail above holds as well, only the sign of the voltage gain being changed in Equation 12:

$$G = \frac{\Delta V_{out}}{\Delta V_{in}} = N \cdot \frac{R_{601}}{R_{602}}$$

This function is useful if a phase inversion is required in the buffer amplifier, such as, for example, for phased microphone arrays (directional microphone applications). The gain and its sign may be easily programmed electrically by building the $M_{610}$ with multiple gate fingers and connecting those gates to either the $M_{652}$ gate, the $M_{653}$ gate, or to the ground.

Figure 8:
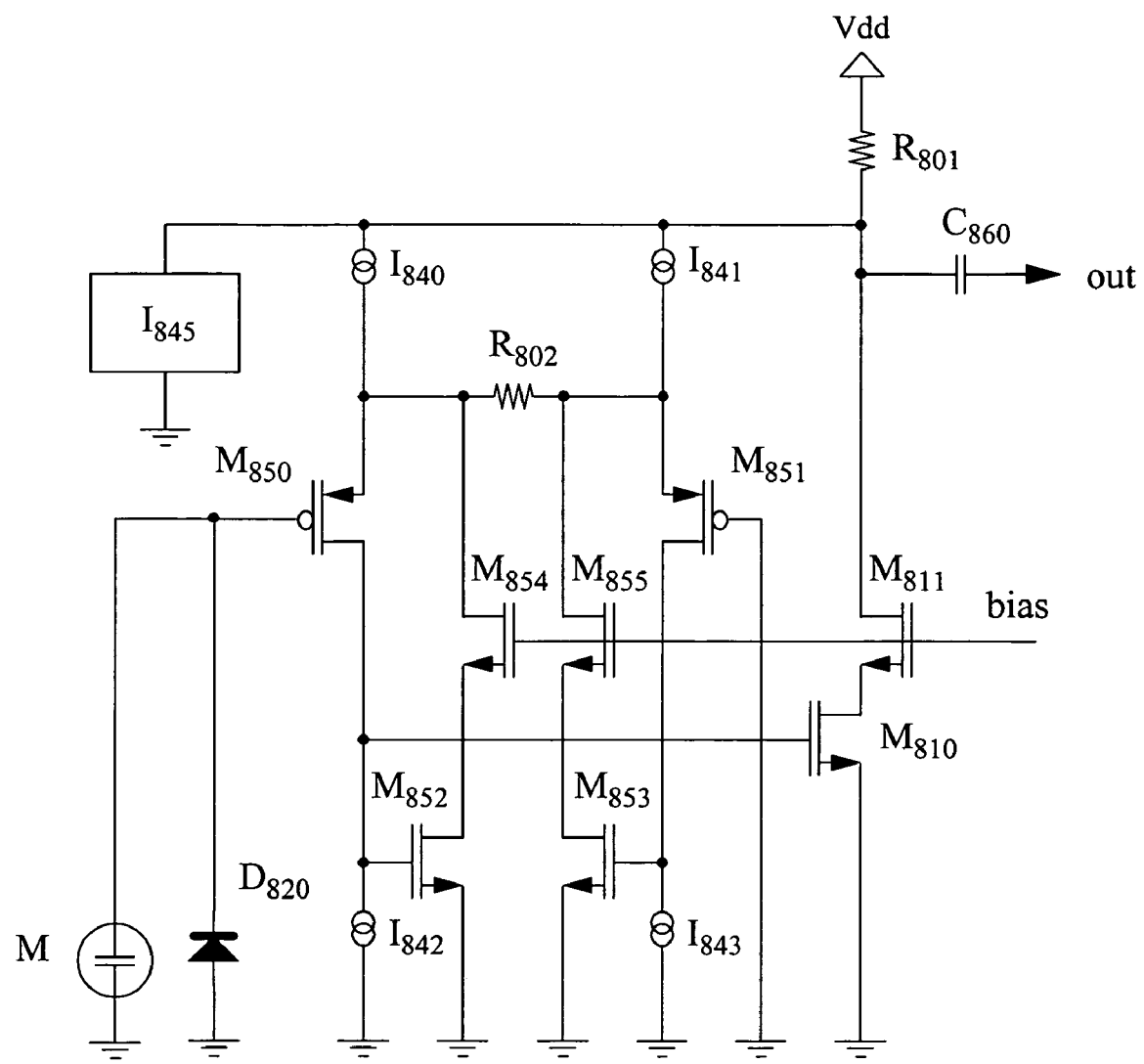
FIG. 8 is a schematic diagram of a self-biased, phantom powered buffer amplifier device for an electrecret microphone, according to yet another alternate embodiment of the invention.

An enhanced version of the proposed circuit is shown in FIG. 8, where all the transistors in the current mirror are cascoded to increase the output impedance and overall linearity.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In the foregoing description, the invention has been described with reference to specific exemplary embodiments thereof. It will, however, be evident that various modifications and changes be made thereto without departing from the broader spirit and scope of the invention as set forth in the appended claims. The specification and drawings are, accordingly, to be regarded in an illustrative sense rather than a restrictive sense.

The invention claimed is:

1. An amplifier circuit comprising:
   a power and signal terminal;
   a reference terminal;
   an input terminal;
   a current source circuit;
   an input diode coupled across the input and reference terminals for self biasing;
   and a linear transconductance amplifier device which includes a first and second input terminals coupled to the input and reference terminal of the buffer amplifier, and an output current terminal coupled to the power and signal terminal of the buffer amplifier.

2. The circuit of claim 1 wherein the overall gain and its sign can be changed by changing the value and sign of a transconductance gain for the transconductance amplifier.

3. The circuit of claim 1 wherein the current source circuit provides a bias current substantially independent of the voltage level at the power and signal terminal.

4. The circuit of claim 1 wherein the linear transconductance amplifier includes a resistor and a current mirror to set the value of the transconductance gain.

5. The circuit of claim 4 wherein the linear transconductance amplifier is based on a local feedback circuit to linearize the transconductance transfer characteristic.

6. The circuit of claim 4 wherein the linear transconductance amplifier uses cascode current mirrors and current sources to improve output impedance and the overall linearity.

7. A method comprising:
   receiving a direct current (DC) power signal and providing at least one bias current for a transconductance amplifier;
   receiving a microphone signal from an electrecret microphone coupled to the transconductance amplifier;
   wherein a current in a second terminal of the transconductance amplifier is substantially proportional to the microphone signal; and
   providing a reference level for the input signal.

8. The method of claim 7, further comprising modifying an overall gain and its sign by modifying a value and sign of a transconductance gain for the transconductance amplifier.

9. An apparatus comprising:
   means for receiving a direct current (DC) power signal and providing at least one bias current for a transconductance amplifier;

means for receiving a microphone signal from an electrecret microphone coupled to the transconductance amplifier;

wherein a current in a second terminal of the transconductance amplifier is substantially proportional to the microphone signal; and means for providing a reference level for the input signal.

10. The apparatus of claim 9, further comprising means for modifying an overall gain and its sign by modifying a value and sign of a transconductance gain for the transconductance amplifier.

11. A computer readable medium containing executable instructions, which, when executed in a processing system, cause said processing system to perform a method comprising:

receiving a direct current (DC) power signal and providing at least one bias current for a transconductance amplifier;

receiving a microphone signal from an electrecret microphone coupled to the transconductance amplifier;

wherein a current in a second terminal of the transconductance amplifier is substantially proportional to the microphone signal; and providing a reference level for the input signal.

12. The computer readable medium of claim 11, wherein said method further comprises modifying an overall gain and its sign by modifying a value and sign of a transconductance gain for the transconductance amplifier.

\* \* \* \* \*